United States Patent
Katsuhara et al.

(10) Patent No.: US 9,508,127 B1
(45) Date of Patent: Nov. 29, 2016

(54) PROCESSING FOR CREATING A TRANSMISSION IMAGE WITHOUT ARTIFICIAL NOISES

(71) Applicant: Konica Minolta Laboratory U.S.A., Inc., San Mateo, CA (US)

(72) Inventors: Shinsuke Katsuhara, Foster City, CA (US); Ronald Larcom, San Jose, CA (US); Satoshi Kasai, San Jose, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days.

(21) Appl. No.: 14/788,617

(22) Filed: Jun. 30, 2015

(51) Int. Cl.
*G06K 9/40* (2006.01)
*G06T 5/00* (2006.01)
*G06T 7/00* (2006.01)
*G06T 5/20* (2006.01)
*G01R 33/565* (2006.01)

(52) U.S. Cl.
CPC ............... *G06T 5/002* (2013.01); *G06K 9/40* (2013.01); *G06T 5/20* (2013.01); *G06T 7/0085* (2013.01); *G01R 33/5659* (2013.01); *G06T 2207/10004* (2013.01); *G06T 2207/10081* (2013.01); *G06T 2207/10088* (2013.01); *G06T 2207/10116* (2013.01); *G06T 2207/10132* (2013.01)

(58) Field of Classification Search
CPC ......... G06T 5/002; G06T 5/003; G06T 5/20; G06T 11/008; G06T 2207/0081; G06T 2207/20192; G06T 2207/30004; G06T 2207/10081; G06T 2207/10088; G06T 2207/30041; G01R 33/5659; G06K 2209/05; G06K 9/0061

USPC .................................................. 382/274-275
See application file for complete search history.

(56) References Cited

U.S. PATENT DOCUMENTS

| | | | | |
|---|---|---|---|---|
| 5,025,463 A | * | 6/1991 | Saito ...................... | A61B 6/032 378/19 |
| 5,551,431 A | * | 9/1996 | Wells, III ........... | G01R 33/5659 324/307 |
| 7,027,558 B2 | * | 4/2006 | Ghelmansarai .......... | A61B 6/00 250/370.09 |
| 7,860,341 B2 | * | 12/2010 | Star-Lack ............ | A61N 5/1049 382/131 |
| 8,536,535 B2 | | 9/2013 | Amitani et al. | |
| 8,591,108 B2 | * | 11/2013 | Tada ....................... | A61B 6/00 378/207 |
| 8,605,967 B2 | * | 12/2013 | Dahlqvist Leinhard ............ | G01R 33/4828 382/128 |
| 8,861,817 B2 | * | 10/2014 | Imamura .............. | A61B 5/0066 351/206 |
| 8,942,447 B2 | * | 1/2015 | Yu ........................ | G06K 9/0014 382/128 |

* cited by examiner

*Primary Examiner* — Kanjibhai Patel
(74) *Attorney, Agent, or Firm* — Osha Liang LLP

(57) ABSTRACT

A method for reducing a linear artifact in a medical image. The method includes identifying, in the medical image, a region occupied by the linear artifact and isolating, in the region, a signal intensity component attributed to the linear artifact from an overall signal intensity of the region. The method further includes obtaining a corrected signal intensity by subtracting, in the region, the signal intensity component attributed to the linear artifact from the overall signal intensity of the region, and, after obtaining the corrected signal intensity, correcting a contrast in the region to match the contrast in surrounding regions.

20 Claims, 7 Drawing Sheets

Low-pass filtered image sample　　　Low-pass filtered image sample　　　Mid-frequency components
(low/mid frequency components)　　　(low frequency components)　　　　　of image sample Raw X-ray image　　　　　　　　Processed X-ray image with
with artifact　　　　　　　　　　　artifact removed

PROCESSING FOR CREATING A TRANSMISSION IMAGE WITHOUT ARTIFICIAL NOISES

BACKGROUND

Medical imaging (e.g., X-ray imaging and computed tomography imaging) is commonly used by medical professionals for diagnostic purposes. Medical professionals may analyze and interpret a patient's medical image in order to diagnose the patient's illness/injury. Artifacts in the medical image may complicate the analysis of the medical image and may prevent the medical professional from properly interpreting the medical image. Linear or curvilinear artifacts are a particular class of artifacts in medical images that may result from linear structures such as overlapping X-ray flat panel detectors or linear (including curvilinear) objects such as endotracheal tubes in the imaged region.

Although affected regions in the medical image may be adjusted manually to facilitate subsequent analysis of the medical image, such adjustment, performed by a medical professional, may be time consuming and therefore costly. Accordingly, tools that reduce the visibility of linear or curvilinear artifacts in medical images and that only require little supervision by a medical professional are desirable.

SUMMARY

In general, in one aspect, the invention relates to a method for reducing a linear artifact in a medical image. The method includes identifying, in the medical image, a region occupied by the linear artifact and isolating, in the region, a signal intensity component attributed to the linear artifact from an overall signal intensity of the region. The method further includes obtaining a corrected signal intensity by subtracting, in the region, the signal intensity component attributed to the linear artifact from the overall signal intensity of the region, and, after obtaining the corrected signal intensity, correcting a contrast in the region to match the contrast in surrounding regions.

In general, in one aspect, the invention relates to a system for reducing a linear artifact in a medical image. The system includes a computer processor, an artifact detection engine (ADE) executing on the computer processor and an image adjustment engine (IAE) executing on the computer processor. The ADE identifies, in the medical image, a region occupied by the linear artifact, and the IAE isolates, in the region, a signal intensity component attributed to the linear artifact from an overall signal intensity of the region, obtains a corrected signal intensity by subtracting, in the region, the signal intensity component attributed to the linear artifact from the overall signal intensity of the region, and, after obtaining the corrected signal intensity, corrects a contrast in the region to match the contrast in surrounding regions.

In general, in one aspect, the invention relates to a non-transitory computer readable medium (CRM) storing instructions for reducing a linear artifact in a medical image. The instructions include functionality for identifying, in the medical image, a region occupied by the linear artifact and for isolating, in the region, a signal intensity component attributed to the linear artifact from an overall signal intensity of the region. The instructions further include functionality for obtaining a corrected signal intensity by subtracting, in the region, the signal intensity component attributed to the linear artifact from the overall signal intensity of the region; and, after obtaining the corrected signal intensity, correcting a contrast in the region to match the contrast in surrounding regions.

DETAILED DESCRIPTION

Figure 1:
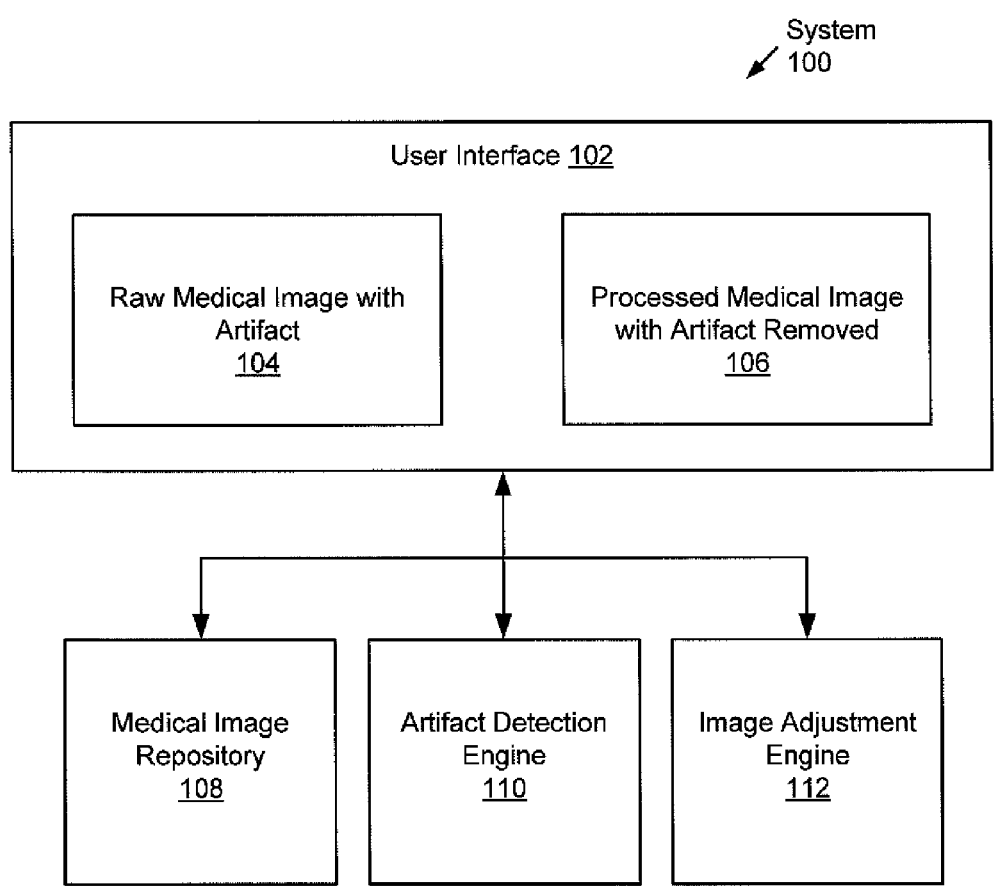
FIG. 1 shows a schematic diagram of a system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A wide range of medical imaging methods, for example, X-ray radiography, computed tomography, etc., are used in modern medicine to create visual representations of the interior of a patient's body for clinical analysis and medical intervention. Medical images obtained from the patient may be examined by a medical professional, but may contain artifacts that complicate and/or reduce the accuracy of the examination.

As mentioned above, linear or curvilinear artifacts are a particular class of artifacts in medical images. Linear artifacts may result from, for example, the stitching of an X-ray image from multiple raw images captured by slightly overlapping X-ray flat panel detectors. In the regions where the stitching is performed, the image may differ in brightness, contrast, granularity, etc., in comparison to other image regions, thus complicating the interpretation of anatomical details in regions where the stitching was performed.

Linear or curvilinear artifacts in medical images may also be caused by foreign objects in the imaged region. Consider, for example, a scenario where an X-ray image of an intubated patient is taken. The endotracheal tube used for the intubation locally attenuates the X-ray signal reaching the detector panels. Although anatomical details may still be shown in the area of the endotracheal tube, these details may be difficult to interpret because the image characteristics, including, for example, brightness, contrast and granularity, differ from the surrounding regions where the X-ray signal reaches the detector panels without being attenuated by the endotracheal tube.

Embodiments of the invention provide a method, a system, and a non-transitory computer readable medium (CRM) for reducing linear and curvilinear artifacts in medical images.

In one or more embodiments of the invention, medical images are first analyzed for distracting linear or curvilinear artifacts, and are subsequently processed to reduce the visibility of the detected linear or curvilinear artifacts, or to remove the artifacts. The processing may result in medical images where the interpretation by a medical professional is no longer impaired by the linear or curvilinear artifacts. As a result of the processing of the medical images in accordance with one or more embodiments of the invention, the linear or curvilinear artifacts may become invisible, near-invisible, or may be at least reduced to the extent that they don't interfere with the interpretation of image content in the area of the linear or curvilinear artifacts.

FIG. 1 shows a system (100) in accordance with one or more embodiments of the invention. The system (100) includes a user interface (UI) (102), a medical image repository (108), an artifact detection engine (110) and an image adjustment engine (112). Each of these components may be located on the same computing device (e.g., a desktop computer, server, laptop computer, tablet computer, smart phone, radiology computer workstation, etc.) or may be located on different computing devices connected by a network of any size having wired and/or wireless segments.

In one or more embodiments of the invention, the system (100) includes the UI (102). The UI (102) may be configured to enable a user (e.g., a medical professional operating the system (100)) to retrieve a raw medical image (104), i.e., an image that includes a linear or curvilinear artifact, from the medical image repository (108) and to save the processed image (106), i.e., the image where the artifact has been removed, to the medical image repository (108). The UI (102) may further be configured to allow the user to initiate and control the processing of the image by the artifact detection engine (110) and by the image adjustment engine (112). The user may, for example, make adjustments to processing parameters of the artifact detection engine (110) and/or of the image adjustment engine (112) (e.g., the user may choose to perform or bypass a particular processing step, choose particular processing algorithms, tune processing algorithm parameters, etc.). In one embodiment of the invention, the UI (102) is a graphical user interface (GUI) that may be used to display the raw image (104) and the processed image (106) to the user. In addition, the GUI may display intermediate stages of an image being processed. For example, the GUI may display an image resulting from performing a single processing step of a chain of processing steps, thus allowing the user to assess the effectiveness of the method being used in this particular processing step. The user may then interactively optimize the processing performance. The user may, for example, tune a particular processing parameter by operating a slider widget in the GUI, and the GUI may display, in real-time, an updated processing result, based on the adjusted parameter value. Accordingly, the GUI is configured to accept user input using one or more GUI widgets (e.g., sliders, radio buttons, drop-down lists, textboxes, etc.), thereby enabling the user to interact with the displayed content. The user may in addition be able to zoom into the displayed medical image for closer examination, thus allowing the user to further assess the success of the artifact removal.

In one or more embodiments of the invention, the system (100) includes the medical image repository (108). The medical image repository (108) may be a database or directory on a local or remote storage device where medical images are stored, for example in a picture archiving and communication system (PACS).

In one or more embodiments of the invention, the system (100) includes the artifact detection engine (110). The artifact detection engine (110) may be used to detect linear or curvilinear artifacts in the raw medical image (104) to be processed. In one embodiment of the invention, the raw medical image with the artifact (104), selected by the user via the user interface (102), is retrieved from the medical image database (108) and provided to the artifact detection engine (110), along with configuration parameters selected by the user. The configuration parameters may include, for example, a specific algorithm selected by the user and parameters to configure the execution of the algorithm by the artifact detection engine (110). The details of the detection of linear or curvilinear artifacts by the artifact detection engine (110) in accordance with one or more embodiments are described below, with reference to FIG. 2.

The image adjustment engine (112) of the system (100) may be used to reduce or eliminate the linear or curvilinear artifact(s) detected in a medical image by the artifact detection engine (110). In one embodiment of the invention, the image adjustment engine may contain multiple processing stages to perform, for example, signal intensity corrections, granularity corrections, contrast corrections, etc. The user may parameterize the image adjustment engine (112) via the user interface (102) to select processing stages to be used for performing the image adjustment, and to parametrize the selected processing stages. In one embodiment of the invention, a single processing stage or different combinations of multiple processing stages may be used to reduce the linear or curvilinear artifact(s) detected in the medical image. The details of the image adjustment performed by the image adjustment engine (112) in accordance with one or more embodiments are described below, with reference to FIG. 2.

While FIG. 1 shows a configuration of certain components, other configurations may be used without departing from the scope of the invention. For example, various components may be combined to create a single component. As another example, the functionality performed by a single component may be performed by two or more components.

Figure 2:
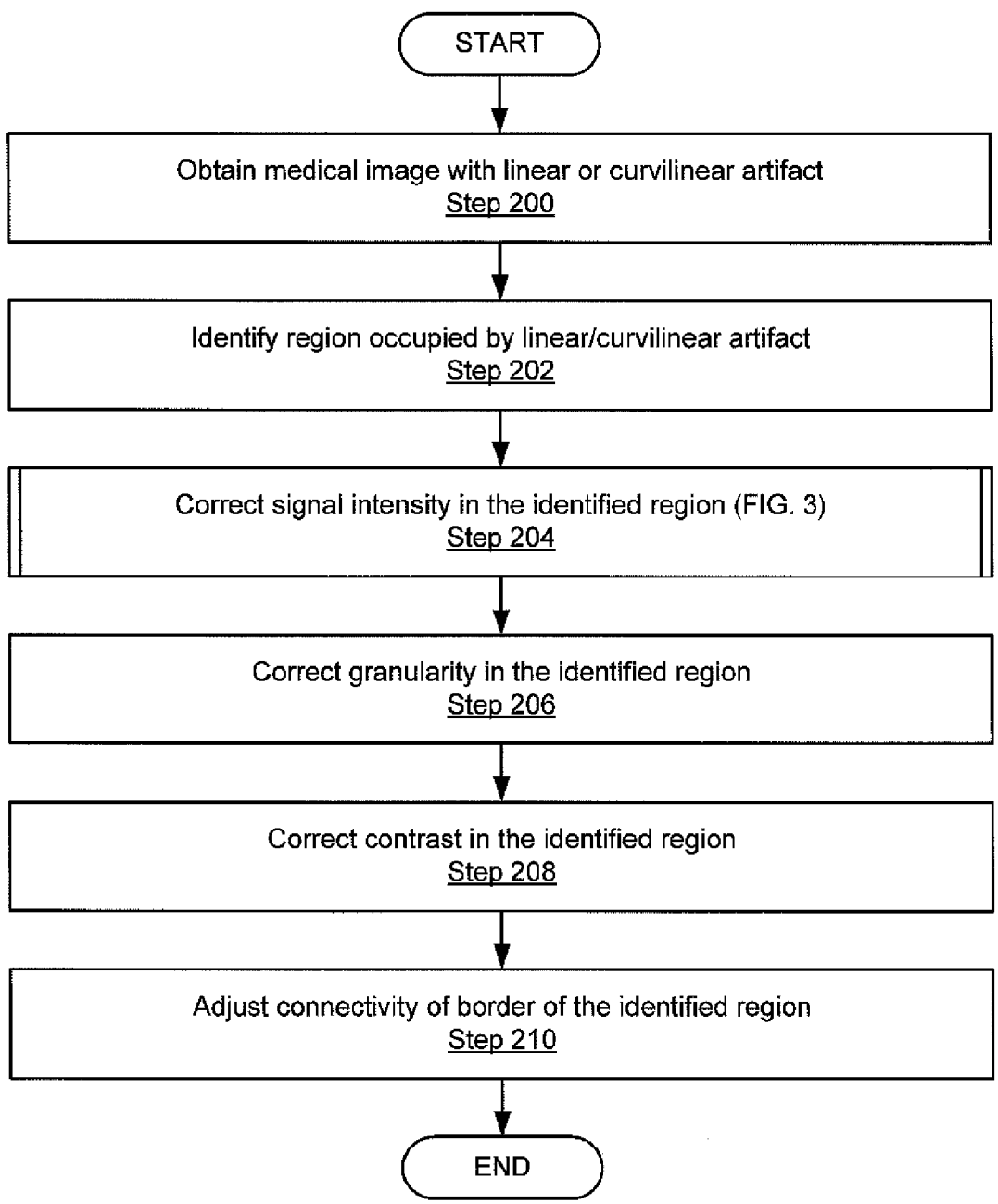
FIG. 2 shows a flowchart in accordance with one or more embodiments of the invention.

FIG. 2 shows a flowchart in accordance with one or more embodiments of the invention. The process depicted in FIG. 2 may be used to reduce linear artifacts in medical images. One or more of the steps in FIG. 2 may be performed by the components of the system (100), discussed above with reference to FIG. 1. In one or more embodiments of the invention, one or more of the steps shown in FIG. 2 may be omitted, repeated, and/or performed in a different order than the order shown in FIG. 2. Accordingly, the scope of the invention should not be considered limited to the specific arrangement of steps shown in FIG. 2. Further, even though the following description of FIG. 2 covers the processing of a single linear or curvilinear artifact in a medical image, the same methods may apply to the processing of multiple linear or curvilinear artifacts in a medical image.

Certain aspects of the processing of the artifact may be direction-dependent. The following conventions will be used to describe the directionality of the processing of the artifact throughout the subsequent discussion of Steps 200-210. A linear or curvilinear artifact occupies a region of a medical image. The region is formed by rows and columns of pixels. The linear or curvilinear artifact, being an elongated structure, has two short sides and two long sides. A row of pixels is oriented in the direction parallel to the short sides, i.e., in a transversal direction, and a column of pixels is oriented in the direction parallel to the long sides, i.e., in a longitudinal direction. A row of pixels may be one pixel high and may traverse the entire width of the artifact. A column of pixels may be one pixel wide and may span the entire length of the artifact. In one embodiment of the invention, the artifact is not necessarily aligned with the rectangular shape of the medical image, i.e., it may be at an oblique angle. Further, the artifact may be a curvilinear artifact. In these cases, rows and columns of pixels of the artifact may be oriented in directions deviating from the rows and columns of pixels of the medical image, and are determined based on the geometry of the artifact.

For illustrative purposes, steps of the method described in FIG. 2 may include references to the examples shown in FIGS. 4A-4I. However, those skilled in the art will appreciate that the invention is not limited to the examples described in FIGS. 4A-4I. A detailed description of the examples in FIGS. 4A-4I is provided below.

Initially, a medical image that includes a linear or curvilinear artifact is obtained in Step 200. The medical image may be obtained from the medical image repository.

In Step 202, the distracting linear or curvilinear artifact is identified in the medical image by the artifact detection engine. The linear or curvilinear artifact may be a region in the image where, for example, the signal intensity, granularity and/or sharpness of the image deviate from surrounding areas. In one or more embodiments of the invention, the linear or curvilinear artifact is detected using computer-aided detection. The linear or curvilinear artifact may be identified using, for example, edge detection techniques. Various edge detection algorithms, including, but not limited to, Canny edge detectors, Sobel filters, and fuzzy logic methods may be employed for edge detection. Alternatively, any other method suitable for detecting discontinuities including signal intensity, granularity, sharpness, etc., in digital images may be used. The artifact detection may further exploit geometric characteristics in order to detect the edges of the linear or curvilinear artifact. For example, the assumption that artifacts are linear or curvilinear may be used to limit the detected edges to linear or curvilinear geometries. An additional assumption may be that the artifact is rectangular, thereby limiting the detection to linear artifacts.

In one embodiment of the invention, an approximate location of the linear or curvilinear artifact may be identified prior to applying the edge detection algorithm, thereby reducing the risk that linear or curvilinear anatomical structures are falsely classified as artifacts. The location may be determined interactively, for example, by a user pointing at the artifact in the medical image displayed by the GUI of the system, or automatically, by a classifier capable of distinguishing anatomical linear or curvilinear structures from linear or curvilinear artifacts. Alternatively, the approximate location of the artifact may be known, for example in case of an X-ray system with multiple X-ray flat panel detectors permanently installed in fixed locations, thus generating artifacts in reproducible areas of the medical image.

The detection result produced by the artifact detection engine may be a border that identifies the edges of the linear or curvilinear artifact, thereby circumscribing the linear or curvilinear artifact. In one or more embodiments of the invention, an artifact, detected in Step 202, may have zones with different characteristics (e.g., with changing signal level, contrast, etc.).

Figure 4A:
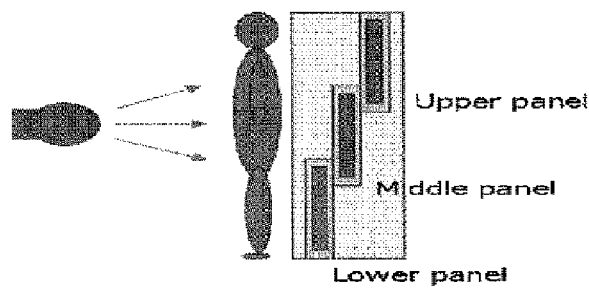
FIGS. 4A-4I show examples in accordance with one or more embodiments of the invention.
Figure 4B:
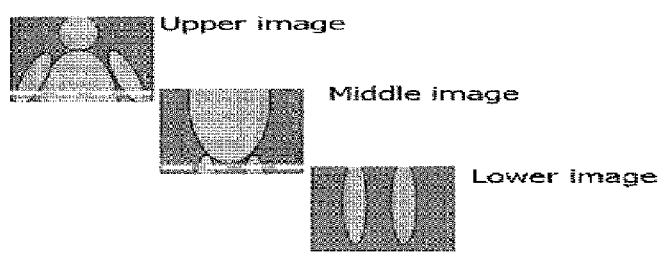
Figure 4C:
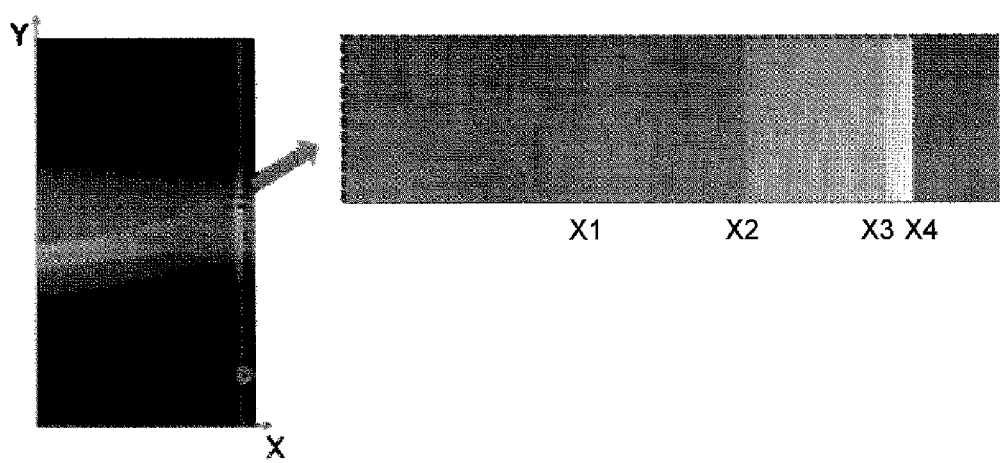

Consider the sample X-ray image in FIG. 4C, obtained using the X-ray setup shown in FIG. 4A. The left panel of FIG. 4C shows an X-ray image of a bone extending in an approximately horizontal direction (x-direction). A prominent vertically (y-direction) extending linear artifact is visible near the right border of the image. The linear artifact is a result of the X-ray detector panel overlap shown in FIG. 4A. The linear artifact, occluding parts of the bony structure, may complicate the analysis of the X-ray image by a medical professional. The right panel of FIG. 4C shows an enlarged view of the linear artifact that reveals that the linear artifact is composed of multiple adjacent stripes that occlude the underlying bony structure to different degrees. The stripes extend along the entire length of the artifact from the top to the bottom of the X-ray image. At least three longitudinally extending zones with different artifact signal intensities are distinguishable: X1-X2, X2-X3, and X3-X4. In the zone ranging from X1-X2, the deviation from the non-artifact region to the left of X1 is barely visible, whereas in the zone ranging from X3 to X4 the deviation from the non-artifact region to the right of X4 is highly visible. The artifact detection described in Step 202 detects the entire artifact including all zones (X1-X4) of different artifact signal intensity as one single artifact, i.e., the artifact detection engine determines X1 to be the left edge of the artifact and X4 to be the right edge of the artifact.

In Step 204, the signal intensity in the region of the medical image, occupied by the linear or curvilinear artifact, identified in Step 202, is adjusted by the image adjustment engine. In one or more embodiments of the invention, the medical image is a monochromatic image, e.g., a grayscale image, i.e., each pixel in the image is a single value which carries signal intensity information. In most regions of the image, the signal intensity is determined by the structures being imaged, e.g., by anatomical details. However, linear or curvilinear structures, present during the imaging, may cause linear or curvilinear artifacts in the medical image that are superimposed over the structures being imaged. Accordingly, the signal intensity in regions with artifacts may be determined by the characteristics of the structure being imaged and by the characteristics of the linear or curvilinear structure. The process described in Step 204 identifies the change of signal intensity values that is caused by the artifact. Subsequently, the image is adjusted for the signal intensity change caused by the artifact, thereby generating a corrected image whose content may no longer, or to a lesser extent, be affected by the linear or curvilinear artifact. The details of Step 204 are described in FIG. 3.

In Step 206, the granularity in the image region previously occupied by the artifact (which was removed in Step 204), is adjusted by the image adjustment engine. The linear or curvilinear structure responsible for the linear or curvilinear artifact may have attenuated the imaging signal (e.g., the X-ray signal) reaching the image detector, thus resulting in reduced imaging signal amplitude in the location of the artifact. In order to reduce the visibility of the artifact, the signal intensity in the region of the artifact may have been adjusted as described in Step 204. The signal intensity adjustment performed in Step 204 may have effectively amplified the signal intensity in the region of the artifact, thereby compensating for the imaging signal attenuation in the region of the artifact. The amplification of the signal intensity may, however, have amplified not only the signal intensity associated with actual image content (e.g., anatomical structures), but also noise, including, for example, image detector noise, thus resulting in increased granularity in the region where the artifact has been removed.

Returning to the discussion of Step 206, in one or more embodiments of the invention, the granularity in the region previously occupied by the artifact is corrected by adjusting the granularity to match the granularity in surrounding regions of the medical image, or to match a pre-specified level of granularity. In one embodiment of the invention, the granularity in the image region previously occupied by the artifact and in surrounding image regions is first assessed by inspecting the high frequency image content in those regions. The high frequency image content may be obtained using any method suitable for frequency band decomposition, e.g., using high-pass filtering. High-pass filtered image regions may be obtained, for example, by first acquiring the low and mid-frequency components of the image regions to be high-pass filtered, and then by subtracting the low and mid-frequency components from the image regions, thereby generating image regions that include only the remaining high frequency components. In one embodiment of the invention, a Gaussian filter kernel is used to obtain the low and mid-frequency components by performing a low-pass filtering operation. The filter characteristics of the low-pass filter may have been pre-configured based on known image detector panel characteristics and/or based on a desired granularity. In addition or alternatively, the low-pass filter may be configurable, using, for example, a calibration procedure that may be specific to a particular application, a particular type of artifact, a particular desired granularity result, etc.

Figure 4D:
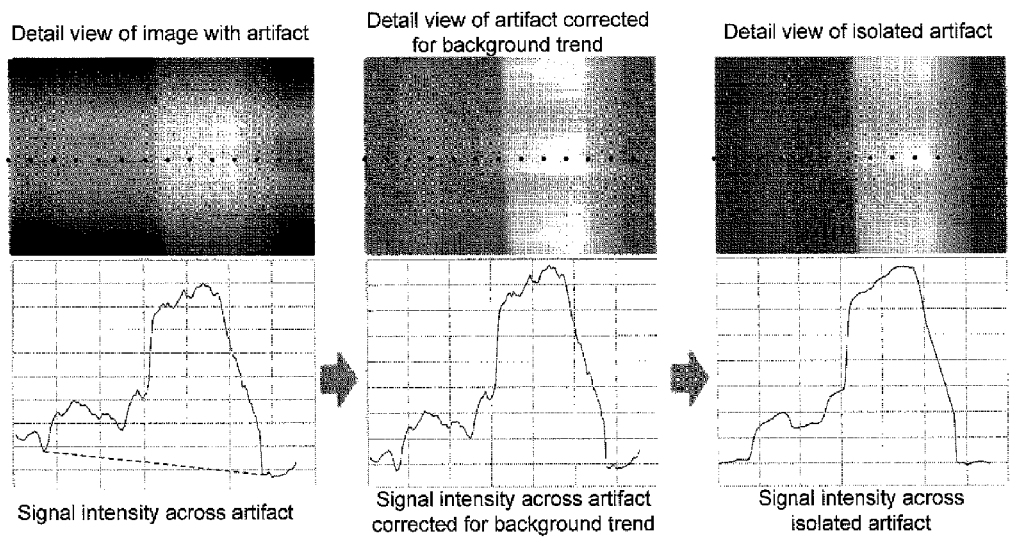
Figure 4E:
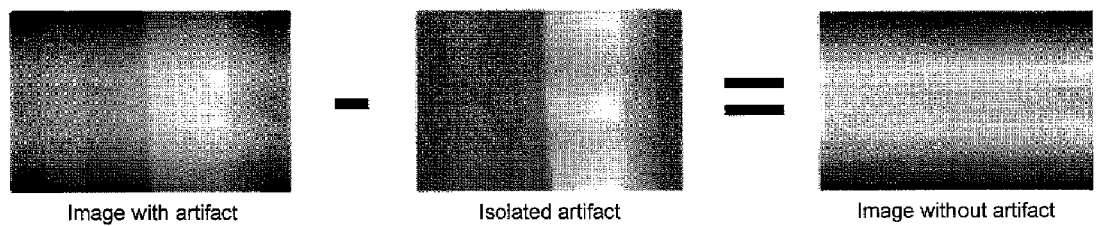
Figure 4F:
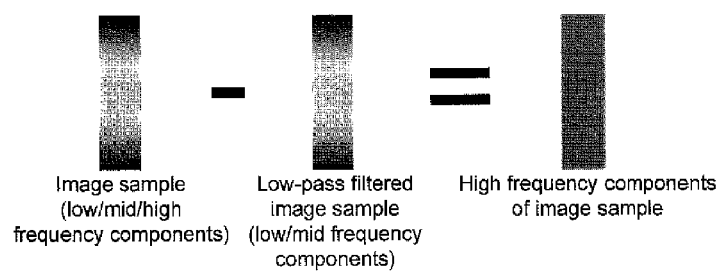

Consider the sample image details of an X-ray image displayed in FIG. 4F. The left panel of FIG. 4F shows an image detail obtained from the right panel of FIG. 4E, i.e., it displays a sample of the image where the artifact was removed using the method described in Step 204. The center panel shows the image detail of the left panel after low-pass filtering. The right panel displays the image detail after subtracting the low and mid-frequency components displayed in the center panel from the low, mid, and high-frequency components of the image displayed in the left panel of FIG. 4F. Mainly high frequency components, i.e., the image content that forms the granularity of the image, remain.

In one embodiment of the invention, the high frequency image content in the region previously occupied by the artifact and in surrounding regions is subsequently quantified and compared. In one embodiment of the invention, variance values are obtained for the high frequency image content in these regions. A variance value may be higher for an image region with increased granularity in comparison with an image region with reduced granularity. In one embodiment of the invention, an attenuation factor is then determined based on the discrepancy between the variance in the region previously occupied by the artifact and the variance in the surrounding regions. The attenuation factor may be a ratio of the variance value for the high frequency image content in the surrounding regions and the variance value for the high frequency image content in the region previously occupied by the artifact. The resulting attenuation factor may be in a range between zero and one. The attenuation factor may be smaller if the variance in the region previously occupied by the artifact is substantially higher than the variance in other surrounding areas, and the attenuation factor may be larger if the variance in the region previously occupied by the artifact is only slightly increased in comparison to the variance in surrounding areas. Although the attenuation factor as described is determined based on a discrepancy of the variance values, those skilled in the art will appreciate that the attenuation factor may be determined using any other measures suitable to assess granularity.

In one or more embodiments of the invention, the high frequency components in the image region previously occupied by the artifact are subsequently attenuated to a degree determined by the attenuation factor. The attenuation may be performed, for example, by multiplying the high frequency components of the intensity values in the image region previously occupied by the artifact with the attenuation factor. A smaller attenuation factor may be used to obtain a more significant granularity decrease, and a larger attenuation factor may be used to obtain a less noticeable granularity decrease. In one or more embodiments of the invention, the multiplication with the attenuation factor decreases the granularity in the image region previously occupied by the artifact to a level similar to the granularity in surrounding regions.

In one or more embodiments of the invention, the granularity correction performed in Step 206 may be performed separately for different areas of the image region previously occupied by the artifact. For example, the image region previously occupied by the artifact may be segmented into multiple smaller areas, where the granularity correction is separately performed. Consider, for example, the artifact of FIG. 4C, which, as previously described, includes multiple adjacent stripes with different attenuation characteristics. After the removal of the artifact in Step 204, stripe-like regions with different degrees of granularity may therefore remain in the region previously occupied by the artifact. In such a scenario, the granularity correction of Step 206 may therefore be performed separately for each of these stripe-like regions. In one embodiment of the invention, an average granularity may further or alternatively be calculated from the granularities detected in different areas of the image region previously occupied by the artifact, and the granularity correction may subsequently be performed based on the average granularity.

In Step 208, the contrast in the image region previously occupied by the artifact (which was removed in Step 204), is adjusted by the image adjustment engine. As previously described, the linear or curvilinear structure responsible for the linear or curvilinear artifact may have attenuated the imaging signal (e.g., the X-ray signal) reaching the image detector, thus resulting in a reduced imaging signal amplitude in the location of the artifact. The signal intensity adjustment performed in Step 204 may amplify the overall signal intensity in the region of the artifact (e.g., the average signal amplitude), but the amplification may not result in a recovery of the contrast level in the region previously occupied by the artifact. Even though the overall signal intensity (i.e., the brightness) may match the signal intensity of surrounding areas, the contrast in the region previously occupied by the artifact may be weaker than in surrounding areas.

Returning to the discussion of Step 208, in one or more embodiments of the invention, the image contrast in the region previously occupied by the artifact is corrected by adjusting the contrast to match the contrast in surrounding regions of the medical image. In one embodiment of the invention, the contrast in the image region previously occupied by the artifact and in surrounding image regions is assessed by inspecting the mid-frequency range image content in those regions. The mid frequency image content may be obtained using any method suitable for frequency band decomposition.

Figure 4G:
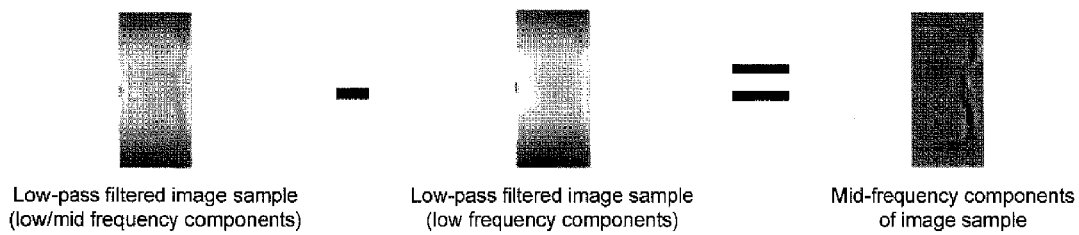

Consider the sample image detail of an X-ray image displayed in FIG. 4G. The left panel of FIG. 4G shows an image detail of an X-ray image where an artifact was removed using the method described in Step 204, and that has been low-pass filtered to eliminate high frequency components, as previously described in Step 206. The center panel shows the same image detail, but the image in addition has been low-pass filtered to also eliminate medium frequency components, i.e., the cutoff frequency used for filtering is lower than the cutoff frequency used in case of the image displayed in the left panel of FIG. 4G. The medium frequency components that were removed represent primarily anatomical details, and accordingly the low-pass filtered image detail in the center panel of FIG. 4G mostly shows very low frequency components that are almost constant across the image. The image detail in the right panel of FIG. 4G is the result of subtracting the center panel image detail from the left panel image detail, thereby generating an image detail that includes mostly mid-frequency components which primarily represent anatomical details, i.e., details of interest where the contrast may need to be adjusted.

The above described isolation of mid-frequency content may be performed for the image region previously occupied by the artifact, and for surrounding regions. In one embodiment of the invention, variance values are subsequently calculated for the mid frequency image content in those regions in order to assess contrast differences.

In one embodiment of the invention, the mid-frequency image content in the regions previously occupied by the artifact and in surrounding regions is subsequently quantified and compared. In one embodiment of the invention, variance values are obtained for the mid-frequency image content in these regions. A variance value may be higher for an image region with increased contrast in comparison to an image region with reduced contrast. In one embodiment of the invention, a gain factor is then determined based on the discrepancy between the variance in the region previously occupied by the artifact and in the surrounding regions. The resulting gain factor may be higher if the variance in the region previously occupied by the artifact is significantly lower than the variance in other surrounding areas, and the gain factor may be lower if the variance in the region previously occupied by the artifact is only slightly lower in comparison to the variance in surrounding areas. Although the gain factor as described is determined based on a discrepancy of the variance values, those skilled in the art will appreciate that the gain factor may be determined using any measures suitable to assess contrast including, for example, mid-frequency band signal energy.

In one or more embodiments of the invention, the mid-frequency components in the image region previously occupied by the artifact are subsequently amplified to a degree determined by the gain factor. The amplification may be performed, for example, by multiplying the mid-frequency components of the intensity values in the image region previously occupied by the artifact with the gain factor. A larger gain factor may be used to obtain a more significant contrast increase, and a smaller gain factor may be used to obtain a less noticeable contrast increase. In one or more embodiments of the invention, the multiplication with the gain factor increases the contrast in the image region previously occupied by the artifact to a level similar to the contrast in surrounding regions.

In one or more embodiments of the invention, the contrast correction performed in Step 208 may be performed separately for different areas of the image region previously occupied by the artifact. More specifically, the variance determination and subsequent contrast adjustment may be performed separately for each column of pixels in a longitudinal direction, i.e., for pixels oriented along the length of the previously removed artifact. A gain factor may then be determined separately for each column of pixels. The gain factor for a column of pixels may be the ratio of the mean variance in the surrounding regions and the variance value obtained for the column of pixels. As illustrated in the sample artifact displayed in FIG. 4C, an artifact may include multiple adjacent stripes with different attenuation characteristics. In the example shown in FIG. 4C, these stripes extend vertically from the top end of the artifact to the bottom end of the artifact. Accordingly performing the variance determination and the subsequent contrast adjustment separately for each column of pixels ensures that the appropriate contrast correction is performed despite changing attenuation characteristics of the artifact in the horizontal direction.

Figure 4H:
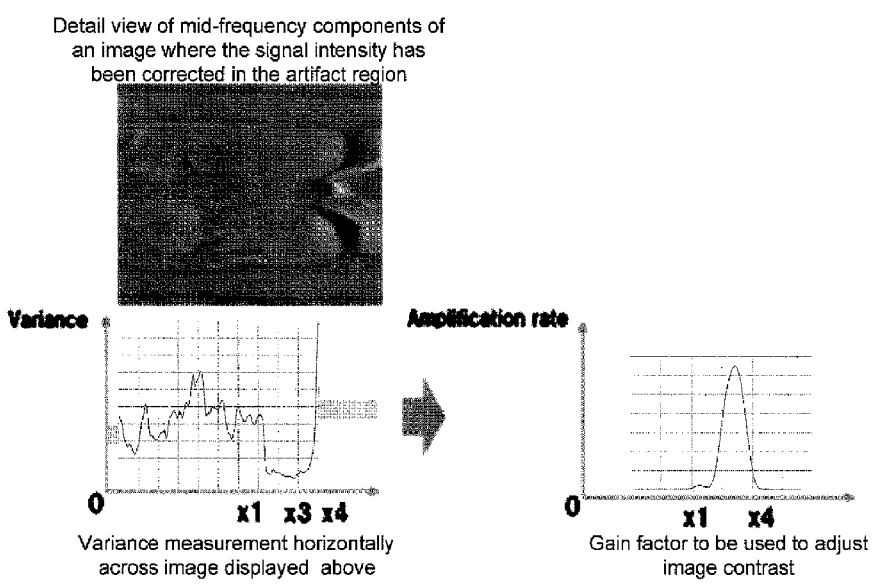

The contrast adjustment is further illustrated in the example shown in FIG. 4H. The upper left panel shows mid-frequency components of an image detail where the signal intensity has previously been corrected by performing Step 204. Only the right half of the image detail was occupied by the artifact. The contrast is therefore reduced in the right half of the image detail, but not in the left half. The lower left panel shows the variance of the mid-frequency components of the image detail. Each data point of the variance curve is obtained from a column of pixels, i.e., each data point is calculated from pixels forming a vertical line. The variance drops significantly in the region previously occupied by the artifact, i.e., in the region between location x1 and x4, i.e., thus indicating that these areas have reduced contrast. A mean variance is calculated from the variance data of the regions surrounding the region previously occupied by the artifact, and subsequently a gain factor is computed, separately for each variance data point in the region previously occupied by the artifact. The right panel of FIG. 4H shows the resulting gain factors. The gain factor curve includes one data point for each column of pixels which may be used for to adjust the contrast of each column of pixels, separately for each column. The gain factors are elevated in the region previously occupied by the artifact in order to increase the contrast to a level similar to the average contrast of the surrounding regions. Although the gain factor curve as described is determined using the mean variance of columns of pixels, those skilled in the art will appreciate that the gain factor curve may be determined using any measures suitable to assess and/or correct image contrast. For example, the median variance of columns of pixels may be used, a linear interpolation may be performed, etc.

In Step 210, the connectivity along the border between the region previously occupied by the artifact and surrounding regions is adjusted by the image adjustment engine. In one or more embodiments of the invention, a blurring function is applied to the border in order to reduce the visibility of the transition between the region previously occupied by the artifact that has been processed by one or more of the Steps 204-208 and surrounding regions. In one embodiment of the invention, Gaussian smoothing is applied to the border region as necessary to reduce the visibility of the border.

Figure 3:
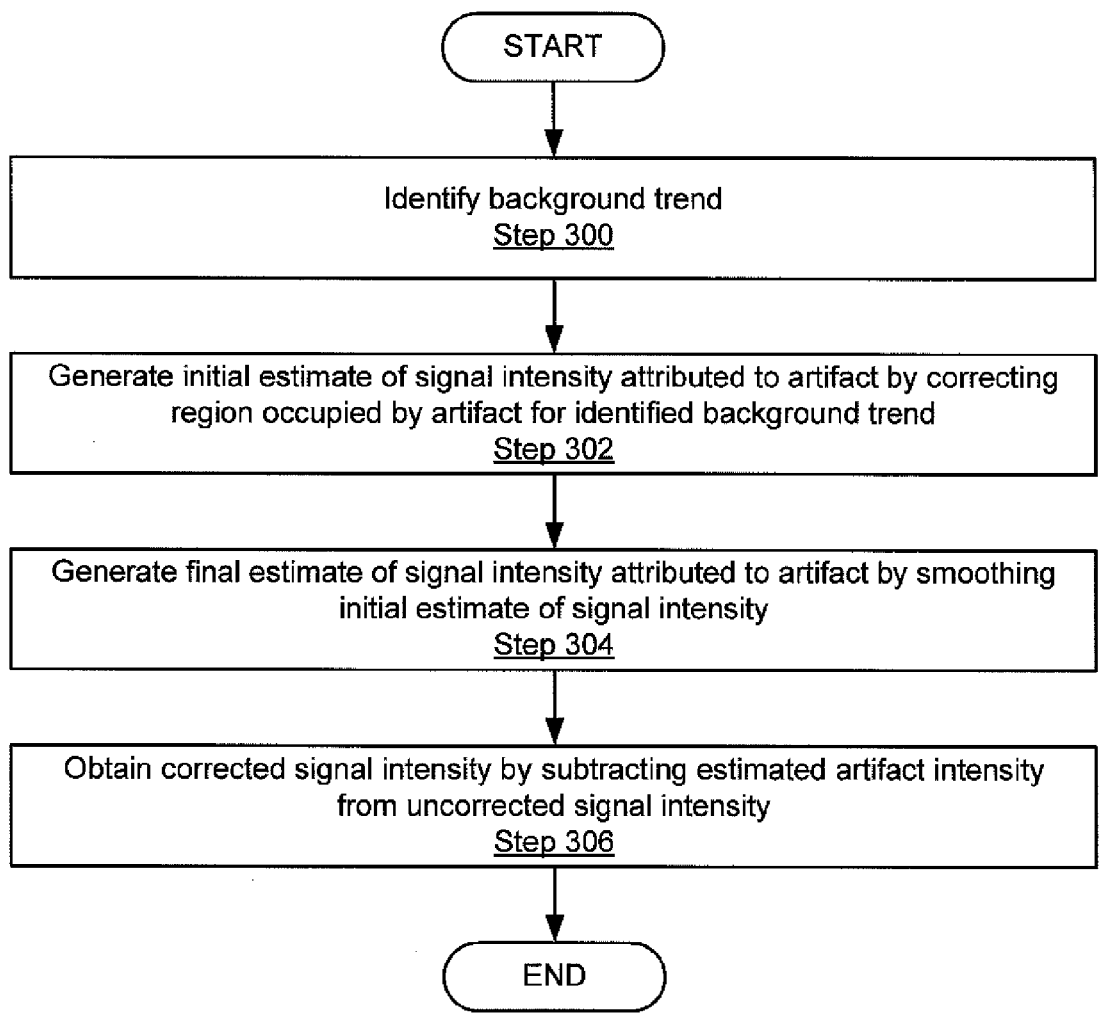
FIG. 3 shows a flowchart in accordance with one or more embodiments of the invention.

FIG. 3 shows a flowchart in accordance with one or more embodiments of the invention. The process described in FIG. 3 may correct the signal intensity in the region occupied by the linear or curvilinear artifact. The signal intensity in the region occupied by the artifact may be a combination of a signal intensity component caused by actual image content (e.g., by anatomical structures being imaged) and a signal intensity component attributed to the artifact. The process described in FIG. 3 may first isolate the signal intensity component caused by the artifact from the signal intensity component caused by actual image content. Subsequently, the signal intensity component attributed to the artifact may be removed from the medical image, thereby generating a corrected medical image whose signal intensity values are no longer affected by the distracting linear or curvilinear artifact. If the medical image includes multiple artifacts, the process described in FIG. 3 may be executed for each artifact.

In Step 300, the background trend in the region of the linear or curvilinear artifact is determined. For the purpose of separating the signal intensity component caused by the artifact from the signal intensity component resulting from actual image content (e.g., anatomical structures being imaged), the actual image content is considered to be background, with the linear or curvilinear artifact being superimposed on the background. Because background signal intensity is not readily separable from artifact signal intensity, an estimation of the background signal intensity may be performed. The estimation may be based on background signal intensities obtained in areas surrounding the artifact, i.e., in areas where the signal intensity is determined solely by background (i.e., actual image content), and where the background signal intensity can therefore be directly obtained.

In one embodiment of the invention, the background trend is the estimate of the background signal intensity, determined from one edge of the artifact to the other edge of the artifact. In one embodiment of the invention, the background trend is determined along the short edge of the linear or curvilinear artifact, i.e., the background trend may be determined for a row of pixels in a transversal direction. More specifically, the background trend may be determined by interpolating between signal intensity values on one side of the artifact, outside the artifact, and signal intensity values on the other side of the artifact, outside the artifact. A signal intensity value of a single pixel, for example of the pixel immediately adjacent to the border of the artifact, may be obtained on each side of the artifact, or an average signal intensity value obtained from multiple pixels may be used for the interpolation. In one embodiment of the invention, pixels with minimal signal intensity values may be chosen on each side of the artifact in order to determine the background signal intensity level outside the borders of the artifact. Because the considered signal intensity values are outside the border of the artifact, they may be determined solely by the background (i.e., actual image content) and are therefore not affected by the artifact. Having obtained background signal intensity values on both sides of the artifact, an interpolation between these background signal intensity values may be used to predict the background signal intensity values in the region of the artifact, i.e., the background trend. In one embodiment of the invention, a linear interpolation may be used to estimate the background trend in the area of the artifact.

To further illustrate the background trend estimation, consider, the sample detail of a medical image with a linear or a curvilinear artifact, shown in the upper left panel of FIG. 4D, which is an enlarged reproduction of the linear artifact shown in FIG. 4C. The lower left panel of FIG. 4D shows the signal intensity for a single row of pixels along the horizontal dotted line in the upper left panel of FIG. 4D. In the sample signal intensity curve shown in the lower left panel of FIG. 4D, a linear interpolation is performed between the pixel values immediately to the left and to the right of the artifact, resulting in the sloped dashed line displayed in FIG. 4D. The dashed line thus represents an estimate of the signal intensity component associated with the background (i.e., the background trend) along the dotted line in the left panel of FIG. 4D.

In one or more embodiments of the invention, the background trend estimation described above produces a background trend estimate for a single row of pixels along the short side of the linear or curvilinear artifact, i.e., across the width of the artifact in a transversal direction. In order to perform a background trend estimation for the entire artifact, the background trend estimation described above may be repeated for each row of pixels across the width of the artifact, thereby generating a separate background trend estimate for each row of pixels. The resulting sequence of background trend estimates may span the entire length of the artifact in a longitudinal direction.

In one embodiment of the invention, smoothing, e.g., using a Gaussian filter kernel, may be applied to the columns of background signal intensity values on both sides of the artifact in a longitudinal direction, prior to performing the interpolation, thereby ensuring that adjacent background trend estimates for adjacent rows of pixels do not markedly fluctuate due to noisy background signal intensity values. In the example displayed in the upper left panel of FIG. 4D, smoothing is obtained by applying the Gaussian filter kernel to the background signal intensity values in a vertical direction (i.e., along the long side of the artifact) on both sides of the artifact.

In Step 302, the region of the linear or curvilinear artifact is corrected for the identified background trend, i.e., a de-trending operation is performed. In one or more embodiments of the invention, the background trend correction is performed separately for each row of pixels in a transversal direction across the width of the artifact. In one embodiment of the invention, the de-trending operation is performed by subtracting the background trend estimate, obtained in Step 300 from the signal intensity values, thereby effectively removing the background.

In the example shown in FIG. 4D, the center lower panel shows the signal of the lower left panel after performing the de-trending operation. The signal intensity outside the artifact becomes zero, whereas the signal intensity in the area of the artifact represents an initial estimate of the signal intensity attributed to the artifact. The center upper panel shows the detail of the upper left panel after the de-trending operation has been performed for all rows of pixels. The central upper panel therefore displays an initial estimate of the artifact without background.

In Step 304, a final estimate of the signal intensity attributed to the artifact is obtained by applying a smoothing operation to the initial estimate of the signal intensity obtained in Step 302. In one embodiment of the invention, the smoothing operation is performed on each column of pixels separately, i.e., in a longitudinal direction along the length of the artifact, thereby preserving differences in the direction across the width of the artifact.

In the Example shown in FIG. 4D, the upper right panel shows the detail of the linear artifact after the smoothing operation, and the lower right panel shows the signal intensity curve of the lower central panel after the smoothing operation has been applied. Due to the directionality of the filtering, the stripes of different signal intensities within the artifact are preserved, while at the same time the noise level is reduced.

In Step 306, a corrected signal intensity is obtained for the region in the medical image that is occupied by the linear or curvilinear artifact, thereby removing the artifact or at least reducing the visibility of the artifact. In one embodiment of the invention, the correction is obtained by subtracting the final estimate of the signal intensity attributed to the artifact, obtained in Step 304, from the uncorrected signal intensity in the medical image.

For illustrative purposes, FIG. 4E provides an example of the subtraction. The left panel shows the detail of the image with the artifact, the central panel shows the final estimate of the signal intensity attributed to the artifact, previously presented in the upper right panel of FIG. 4D (obtained by applying Step 300-304), and the right panel shows the medical image after subtraction of the signal intensity associated with the artifact, thereby revealing anatomical structures that were previously occluded by the linear artifact.

FIGS. 4A-4I show examples in accordance with one or more embodiments of the invention. The examples shown in FIGS. 4A-4I are based on the X-ray system shown in FIG. 4A.

Figure 4I:
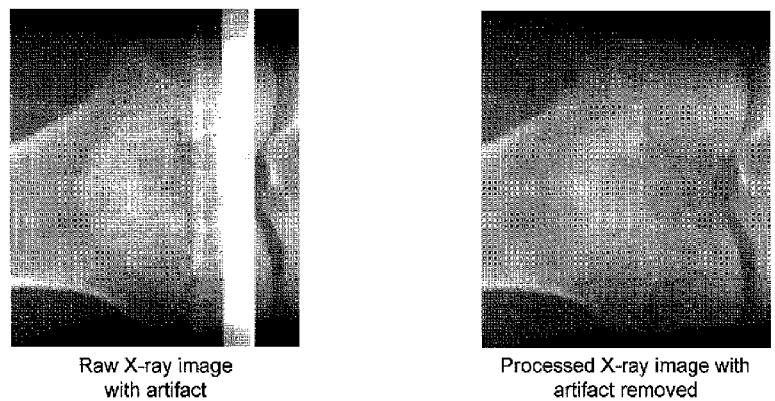

In FIG. 4A, an X-ray signal source emits X-ray signals in the direction of a set of three overlapping X-ray flat panel detectors. The patient is located between the X-ray source and the X-ray flat panel detectors. The X-ray flat panel detectors capture the overlapping X-ray images displayed in FIG. 4B. FIG. 4C shows the transition between the lower and middle image of FIG. 4B after stitching the two images. As a result of the stitching operation, a highly visible and distinct linear structure, i.e., a linear artifact, intersects a bone being imaged. A more detailed description of FIG. 4C is provided above in the description of Step 202. FIGS. 4D and 4E show image details and signal intensity curves illustrating the correction of the signal intensity. A detailed description of FIGS. 4D and 4E is provided above in the description of Steps 300-306. FIG. 4F shows image details illustrating the correction of the granularity. A detailed description of FIG. 4F is provided in the description of Step 206. FIGS. 4G and 4H show image details and signal variance curves illustrating the correction of image contrast. A detailed description of FIGS. 4G and 4H is provided in the description of Step 208. FIG. 4I shows image details of the X-ray image introduced in FIG. 4C. The left panel of FIG. 4I displays the raw X-ray image with the linear artifact occluding significant parts of the anatomical details. The right panel displays the X-ray image where the linear artifact has been successfully removed by applying the process described in FIGS. 2 and 3.

Various embodiments of the invention have at least one or more of the following advantages: the ability to detect a linear or a curvilinear artifact in a medical image, without prior knowledge of the location of the artifact; the ability to remove or at least reduce the visibility of the artifact without prior knowledge of the attenuation characteristics of the artifact; the ability to restore image content previously occluded by the artifact, thereby facilitating the interpretation of the medical image; and the ability to process the artifact without or with minimal supervision by an operator.

Figure 5:
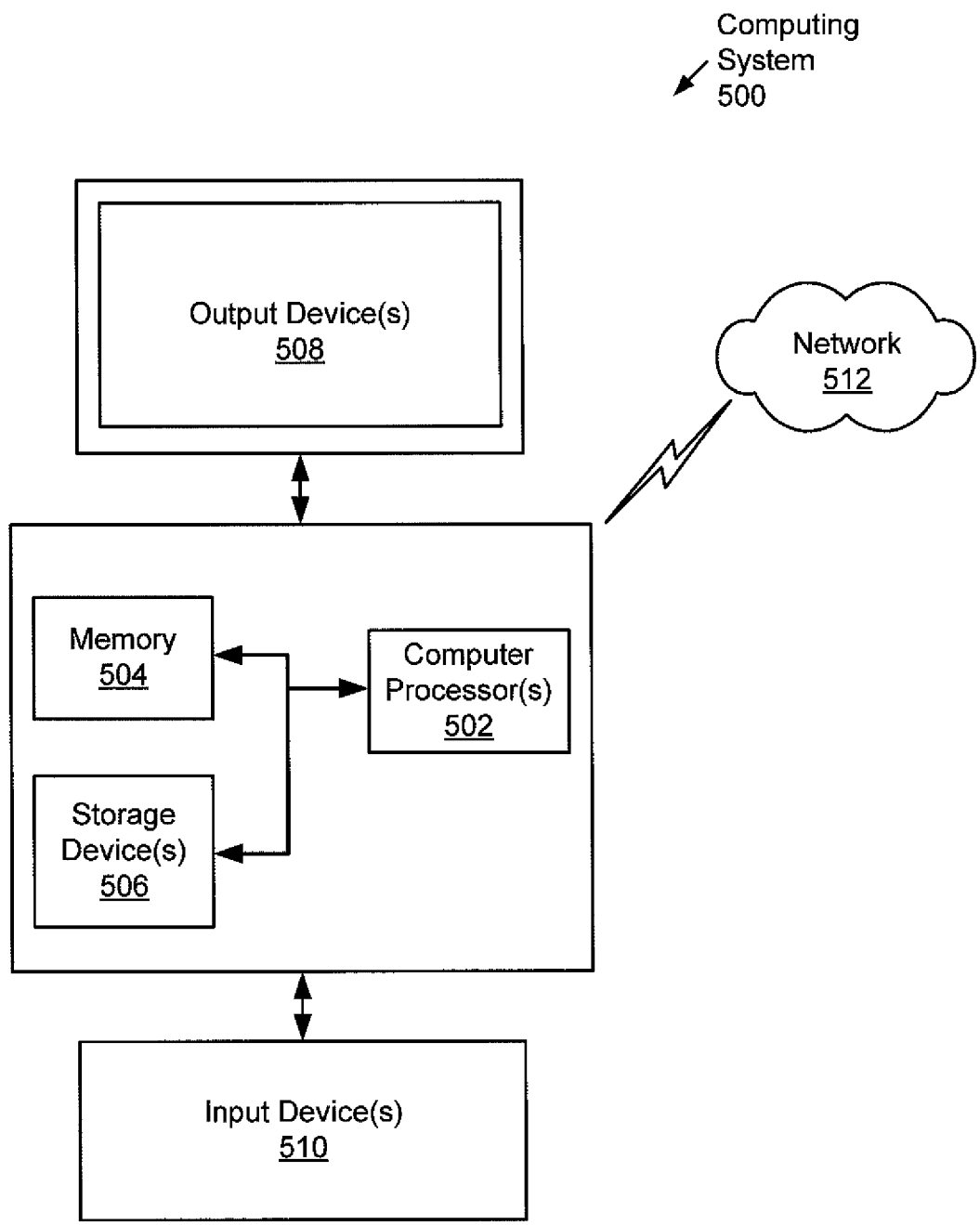
FIG. 5 shows a computer system in accordance with one or more embodiments of the invention.

Embodiments of the invention may be implemented on virtually any type of computing system, regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 5, the computing system (500) may include one or more computer processor(s) (502), associated memory (504) (e.g., random access memory (RAM), cache memory, flash memory, etc.), one or more storage device(s) (506) (e.g., a hard disk, an optical drive such as a compact disk (CD) drive or digital versatile disk (DVD) drive, a flash memory stick, etc.), and numerous other elements and functionalities. The computer processor(s) (502) may be an integrated circuit for processing instructions. For example, the computer processor(s) may be one or more cores, or micro-cores of a processor. The computing system (500) may also include one or more input device(s) (510), such as a touchscreen, keyboard, mouse, microphone, touchpad, electronic pen, or any other type of input device. Further, the computing system (500) may include one or more output device(s) (508), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (500) may be connected to a network (512) (e.g., a local area network (LAN), a wide area network (WAN) such as the Internet, mobile network, or any other type of network) via a network interface connection (not shown). The input and output device(s) may be locally or remotely (e.g., via the network (512)) connected to the computer processor(s) (502), memory (504), and storage device(s) (506). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (500) may be located at a remote location and connected to the other elements over a network (512). Further, one or more embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing a linear artifact in a medical image, the method comprising:
    identifying, in the medical image, a region occupied by the linear artifact;
    isolating, in the region, a signal intensity component attributed to the linear artifact from an overall signal intensity of the region;
    obtaining a corrected signal intensity by subtracting, in the region, the signal intensity component attributed to the linear artifact from the overall signal intensity of the region; and
    after obtaining the corrected signal intensity, correcting a contrast in the region to match the contrast in surrounding regions,
    wherein the isolating of the signal intensity component comprises:

obtaining minimal signal intensities of image pixels outside and adjacent to the region along longitudinal borders of the artifact;

low-pass filtering the minimal signal intensities in a longitudinal direction of the linear artifact;

determining a background trend by interpolating, in a transversal direction of the artifact, between minimal signal intensities of image pixels located on opposite sides of the region;

obtaining an estimate of the signal intensity component attributed to the linear artifact by subtracting the obtained background trend from the overall signal intensity in the region;

determining the signal intensity component attributed to the linear artifact by applying smoothing to the estimate of the signal intensity component, in the longitudinal direction.

2. The method of claim 1 further comprising, after the subtracting of the signal intensity component, correcting a connectivity of the region by blurring a border region that connects the region to surrounding regions.

3. The method of claim 1, wherein the linear artifact is curvilinear.

4. The method of claim 1, wherein the region is identified using an edge detector algorithm.

5. A method for reducing a linear artifact in a medical image, the method comprising:

identifying, in the medical image, a region occupied by the linear artifact;

isolating, in the region, a signal intensity component attributed to the linear artifact from an overall signal intensity of the region;

obtaining a corrected signal intensity by subtracting, in the region, the signal intensity component attributed to the linear artifact from the overall signal intensity of the region; and after obtaining the corrected signal intensity, correcting a contrast in the region to match the contrast in surrounding regions, wherein the correcting of the contrast comprises:
isolating medium frequency components from the corrected signal intensity in the region;
isolating medium frequency components from a signal intensity in the surrounding regions;
matching the contrast of the isolated medium frequency components in the region to the isolated medium frequency components in the surrounding regions, wherein
the matching is performed separately for columns of medium frequency components in the region, oriented in a longitudinal direction of the linear artifact.

6. The method of claim 5, wherein the region is identified using an edge detector algorithm.

7. A method for reducing a linear artifact in a medical image, the method comprising:

identifying, in the medical image, a region occupied by the linear artifact;

isolating, in the region, a signal intensity component attributed to the linear artifact from an overall signal intensity of the region;

obtaining a corrected signal intensity by subtracting, in the region, the signal intensity component attributed to the linear artifact from the overall signal intensity of the region;

after obtaining the corrected signal intensity, correcting a contrast in the region to match the contrast in surrounding regions; and after the subtracting of the signal intensity component, correcting a granularity in the identified region, wherein the correcting of the granularity comprises:
isolating high frequency components from the corrected signal intensity in the region;
isolating high frequency components from a signal intensity in the surrounding regions;
determining a variance value for the high frequency components in the region;
determining a variance value for the high frequency components in the surrounding regions;
determining an attenuation factor, wherein the attenuation factor is a ratio of the variance value for the high frequency components in the surrounding regions and the variance value for the high frequency components in the region;
attenuating the granularity in the region by multiplying the high frequency components of the signal intensity in the region with the attenuation factor.

8. A system for reducing a linear artifact in a medical image, the system comprising:

a computer processor;

an artifact detection engine (ADE) executed on the computer processor and that identifies, in the medical image, a region occupied by the linear artifact;

an image adjustment engine (IAE) executed on the computer processor and that:
isolates, in the region, a signal intensity component attributed to the linear artifact from an overall signal intensity of the region;
obtains a corrected signal intensity by subtracting, in the region, the signal intensity component attributed to the linear artifact from the overall signal intensity of the region; and
after obtaining the corrected signal intensity, corrects a contrast in the region to match the contrast in surrounding regions, wherein the isolating of the signal intensity component comprises:
obtaining minimal signal intensities of image pixels outside and adjacent to the region along longitudinal borders of the artifact;
low-pass filtering the minimal signal intensities in a longitudinal direction of the linear artifact;
determining a background trend by interpolating, in a transversal direction of the artifact, between minimal signal intensities of image pixels located on opposite sides of the region;
obtaining an estimate of the signal intensity component attributed to the linear artifact by subtracting the obtained background trend from the overall signal intensity in the region;
determining the signal intensity component attributed to the linear artifact by applying smoothing to the estimate of the signal intensity component, in the longitudinal direction.

9. The system of claim 8, wherein the IAE further corrects a connectivity of the region by blurring a border region that connects the region to surrounding regions comprising, after the subtracting of the signal intensity component.

10. The system of claim 8, wherein the linear artifact is curvilinear.

11. The system of claim 8, wherein the region is identified using an edge detector algorithm.

12. A system for reducing a linear artifact in a medical image, the system comprising:
a computer processor;
an artifact detection engine (ADE) executed on the computer processor and that identifies, in the medical image, a region occupied by the linear artifact;
an image adjustment engine (IAE) executed on the computer processor and that:
isolates, in the region a signal intensity component attributed to the linear artifact from an overall signal intensity of the region;
obtains a corrected signal intensity by subtracting, in the region, the signal intensity component attributed to the linear artifact from the overall signal intensity of the region; and
after obtaining the corrected signal intensity, corrects a contrast in the region to match the contrast in surrounding regions,
wherein the correcting of the contrast comprises:
isolating medium frequency components from the corrected signal intensity in the region;
isolating medium frequency components from a signal intensity in the surrounding regions;
matching the contrast of the isolated medium frequency components in the region to the isolated medium frequency components in the surrounding regions, wherein
the matching is performed separately for columns of medium frequency components in the region, oriented in a longitudinal direction of the linear artifact.

13. The system of claim 12, wherein the region is identified using an edge detector algorithm.

14. A system for reducing a linear artifact in a medical image, the system comprising:
a computer processor;
an artifact detection engine (ADE) executed on the computer processor and that identifies, in the medical image, a region occupied by the linear artifact;
an image adjustment engine (IAE) executed on the computer processor and that:
isolates, in the region, a signal intensity component attributed to the linear artifact from an overall signal intensity of the region;
obtains a corrected signal intensity by subtracting, in the region, the signal intensity component attributed to the linear artifact from the overall signal intensity of the region; and
after obtaining the corrected signal intensity, corrects a contrast in the region to match the contrast in surrounding regions,
wherein the IAE further corrects a granularity in the identified region, after the subtracting of the signal intensity component, wherein the correcting of the granularity comprises:
isolating high frequency components from the corrected signal intensity in the region;
isolating high frequency components from a signal intensity in the surrounding regions;
determining a variance value for the high frequency components in the region;
determining a variance value for the high frequency components in the surrounding regions;
determining an attenuation factor, wherein the attenuation factor is a ratio of the variance value for the high frequency components in the surrounding regions and the variance value for the high frequency components in the region;
attenuating the granularity in the region by multiplying the high frequency components of the signal intensity in the region with the attenuation factor.

15. A non-transitory computer readable medium (CRM) storing instructions for reducing a linear artifact in a medical image, the instructions comprising functionality for:
identifying, in the medical image, a region occupied by the linear artifact;
isolating in the region a signal intensity component attributed to the linear artifact from an overall signal intensity of the region;
obtaining a corrected signal intensity by subtracting, in the region, the signal intensity component attributed to the linear artifact from the overall signal intensity of the region; and
after obtaining the corrected signal intensity, correcting a contrast in the region to match the contrast in surrounding regions,
wherein the instructions for the isolating of the signal intensity component comprise functionality for:
obtaining minimal signal intensities of image pixels outside and adjacent to the region along longitudinal borders of the artifact;
low-pass filtering the minimal signal intensities in a longitudinal direction of the linear artifact;
determining a background trend by interpolating, in a transversal direction of the artifact, between minimal signal intensities of image pixels located on opposite sides of the region;
obtaining an estimate of the signal intensity component attributed to the linear artifact by subtracting the obtained background trend from the overall signal intensity in the region;
determining the signal intensity component attributed to the linear artifact by applying smoothing to the estimate of the signal intensity component, in the longitudinal direction.

16. The non-transitory CRM of claim 15 wherein the instructions for reducing a linear artifact in a medical image further comprise functionality for correcting a connectivity of the region by blurring a border region that connects the region to surrounding regions, after the subtracting of the signal intensity component.

17. The non-transitory CRM of claim 15, wherein the region is identified using an edge detector algorithm.

18. A non-transitory computer readable medium (CRM) storing instructions for reducing a linear artifact in a medical image, the instructions comprising functionality for:
identifying, in the medical image, a region occupied by the linear artifact;
isolating, in the region, a signal intensity component attributed to the linear artifact from an overall signal intensity of the region;
obtaining a corrected signal intensity by subtracting, in the region, the signal intensity component attributed to the linear artifact from the overall signal intensity of the region; and
after obtaining the corrected signal intensity, correcting a contrast in the region to match the contrast in surrounding regions,
wherein the instructions for the correcting of the contrast comprise functionality for:
isolating medium frequency components from the corrected signal intensity in the region;

isolating medium frequency components from a signal intensity in the surrounding regions;

matching the contrast of the isolated medium frequency components in the region to the isolated medium frequency components in the surrounding regions, wherein the matching is performed separately for columns of medium frequency components in the region, oriented in a longitudinal direction of the linear artifact.

19. The non-transitory CRM of claim 18, wherein the region is identified using an edge detector algorithm.

20. A non-transitory computer readable medium (CRM) storing instructions for reducing a linear artifact in a medical image, the instructions comprising functionality for:

identifying, in the medical image, a region occupied by the linear artifact;

isolating, in the region, a signal intensity component attributed to the linear artifact from an overall signal intensity of the region;

obtaining a corrected signal intensity by subtracting, in the region, the signal intensity component attributed to the linear artifact from the overall signal intensity of the region; and after obtaining the corrected signal intensity, correcting a contrast in the region to match the contrast in surrounding regions, wherein the instructions for reducing a linear artifact in a medical image further comprise functionality for correcting a granularity in the identified region, after the subtracting of the signal intensity component, wherein the correcting of the granularity comprises functionality for:

isolating high frequency components from the corrected signal intensity in the region;

isolating high frequency components from a signal intensity in the surrounding regions;

determining a variance value for the high frequency components in the region;

determining a variance value for the high frequency components in the surrounding regions;

determining an attenuation factor, wherein the attenuation factor is a ratio of the variance value for the high frequency components in the surrounding regions and the variance value for the high frequency components in the region;

attenuating the granularity in the region by multiplying the high frequency components of the signal intensity in the region with the attenuation factor.

* * * * *